US009541969B2

(12) United States Patent
Chen et al.

(10) Patent No.: US 9,541,969 B2
(45) Date of Patent: Jan. 10, 2017

(54) SERVER CHASSIS WITH DIFFERENT WIDTH FRONT END MODULE

(71) Applicant: Quanta Computer Inc., Taoyuan (TW)

(72) Inventors: Chao-Jung Chen, Taoyuan (TW); Yaw-Tzorng Tsorng, Taoyuan (TW); Chun Chang, Taoyuan (TW)

(73) Assignee: Quanta Computer Inc. (TW)

( * ) Notice: Subject to any disclaimer, the term of this patent is extended or adjusted under 35 U.S.C. 154(b) by 0 days.

(21) Appl. No.: 14/688,037

(22) Filed: Apr. 16, 2015

(65) Prior Publication Data
US 2016/0073546 A1 Mar. 10, 2016

Related U.S. Application Data

(60) Provisional application No. 62/047,542, filed on Sep. 8, 2014.

(51) Int. Cl.
H05K 5/02 (2006.01)
G06F 1/18 (2006.01)
H05K 7/14 (2006.01)

(52) U.S. Cl.
CPC ............ *G06F 1/187* (2013.01); *H05K 7/1489* (2013.01)

(58) Field of Classification Search
CPC .......... H05K 5/02; H05K 5/03; H05K 7/1489; H05K 7/1488; H05K 7/14; G06F 1/18
USPC 361/679.33, 790, 801, 752, 727; 312/334.1, 223.2
See application file for complete search history.

(56) References Cited

U.S. PATENT DOCUMENTS

| 6,739,682 B2* | 5/2004 | Shih ..................... A47B 88/044 312/223.1 |
| 6,948,691 B2* | 9/2005 | Brock .................. A47B 88/044 211/175 |
| 9,131,624 B1* | 9/2015 | Johnson ............... H05K 7/1489 |
| 2008/0066340 A1* | 3/2008 | Kakuno .................... F26B 5/04 34/489 |

FOREIGN PATENT DOCUMENTS

CN 203630697 U * 6/2014

OTHER PUBLICATIONS

STIC search report.*
English translation of CN203630697U.*

* cited by examiner

Primary Examiner — Dion R Ferguson
Assistant Examiner — Mandeep S Buttar
(74) Attorney, Agent, or Firm — Nixon Peabody LLP

(57) ABSTRACT

Embodiments generally relate to a optimizing the design of a chassis, such that the chassis features a different width front end hard disk drive module. Key components of the design include chassis flexibility for different hard drive quantities, and sliding rails which can be installed for sliding the chassis in and out of the rack, taking into account the housing contours of both the chassis and the front end hard disk drive module of different width. The rails can be reinforced with different backing materials for improved load support. The sliding rails include an inner set of rails attached to the chassis, and an outer set of rails which extend along the housing of both the chassis and the hard disk drove module.

19 Claims, 8 Drawing Sheets

SERVER CHASSIS WITH DIFFERENT WIDTH FRONT END MODULE

RELATED APPLICATIONS

This application claims priority to U.S. provisional application 62/047,542, filed Sep. 8, 2014, and entitled "Server Chassis with Different Width Front End HDD Module", the disclosure of which is hereby incorporated herein by reference in its entirety for all purposes

FIELD OF THE INVENTION

The disclosure relates generally to chassis design, and in particular to a chassis featuring a different width front end module.

BACKGROUND

Servers are core components for serving computers in a network system. Servers provide a variety of functions for network users, including storage and sharing of resources within a server system. Servers generally contain an architecture with a central processing unit, a memory, one or more hard drives, and other components which are connected through a bus. In general, a server system can consist of one or more server racks and a number of server blades, sleds, or chassis insertable into slots or locations in the server racks that physically supporting one or more servers or other type of computing devices. Typically, the racks and the chassis are designed according to unified international cabinet standards. That is, the physical specifications for the racks and chassis are based on agreed-upon standards. In this way, the configuration, assembly, and management of a server system is convenient and standardized.

Locations within a rack are generally classified according to a standard unit of height for the chassis or multiples thereof, such as 1U, 2U, 3U, etc. Thus, a chassis is referred to as a 1U chassis, meaning that it is one rack unit in height. A 2U server consumes two rack units of space within the rack. In addition to such standard height configurations, there are also standard width configurations for the rack, define by the width of the locations in the rack and accounting for any sliding rails or other attachment devices for attaching the chassis to the rack. Thus, the width dimensions of the chassis are generally constrained by the dimensions of the server rack and the attachment devices.

Typical server cabinets provide hard drive modules which allow for multiple hard drives to be disposed in a portion of a chassis along its width. However, these hard drive modules are generally constrained by the width dimensions of the chassis. This limits the amount of hard drives which will fit inside of the chassis, and thus the hard drive capacity is fixed.

SUMMARY

The present technology provides for the optimized design of a chassis, such that the chassis features a different width front end hard disk drive module. In particular, a front end hard drive module with a width greater than the rest of the chassis. As hard disk drives in a traditional design are limited in quantity according to the housing of the hard disk drive module, which conform to the uniform specifications and width of the chassis, hard drives are typically a restricted resource. This presents problems for the demands of current servers, which can be tasked with storing and utilizing massive amounts of electronic data. The present technology allows for a greater width for hard disk drive modules, leading to a greater quantity of hard drives and more resources for data storage. This allows for chassis flexibility, leading to different hard disk drive quantity. This also allows for sliding rails, which are able to be installed for easy serviceability and maintenance.

To accommodate the chassis of the present technology in a standard rack, the present technology also provides a set of sliding rails that attach to the mounting rails of the server rack. Each of the sliding rails consists of five parts: a front support, a rear support, outer rail, inner rail, and a middle rail. The inner rail extends adjacent to and along the entire length of the narrower, rear portion of the chassis. The inner rail is able to slide out, sliding the chassis along with it. The middle rail is placed outside of the inner rail and extends along the sides of the chassis. The outer rail is placed outside of the middle rail, and extends along the entire length of the chassis. The outer rail is able to slidably engage with the middle rail, such that the outer rail slides forward and back with the middle rail. In the sliding operation, the inner rail slides forward and back first, sliding the chassis with it. Once the entire length of the chassis is slidably engaged, the chassis may still be pulled out further with the outer rail. The outer rail then slides out further, and is slidably engaged with the middle rail, which allows the outer rail to slide forward and back. In addition, a front support piece is dimensioned to accommodate a larger width and extends along the length of the front end width module. The front support piece may contain a flange wall which is placed over the inner rail, outer rail, and middle rail. The front support piece is able to attach to the front mounting rails of the server rack. Finally, a rear support piece extends partway along the length of the chassis, and is able to attach to the rear mounting rails of the server rack. The result of these rails is that the full service chassis can be slid in and out of the server rack easily, and no problems are presented by the differing, larger width of the hard disk drive module.

In some embodiments, the server rack is a 1U server rack, and the hard disk drive module is expanded to fit a quantity of twelve hard disk drives. In other embodiments, the server rack may be 2U, 4U, or another size, and the quantity of hard disk drives which can fit into the hard disk drive module can vary accordingly.

In some embodiments, the front support piece of the rails can be reinforced with ribs. In other embodiments, the front support piece of the rails can be reinforced by metal backing.

In some embodiments, flange walls can appear in opposite directions within the front support piece of the rails, providing increased support and reinforcement.

BRIEF DESCRIPTION OF THE DRAWINGS

Various embodiments or examples of the invention are disclosed in the following detailed description and the accompanying drawings.

DETAILED DESCRIPTION

Figure 1A:
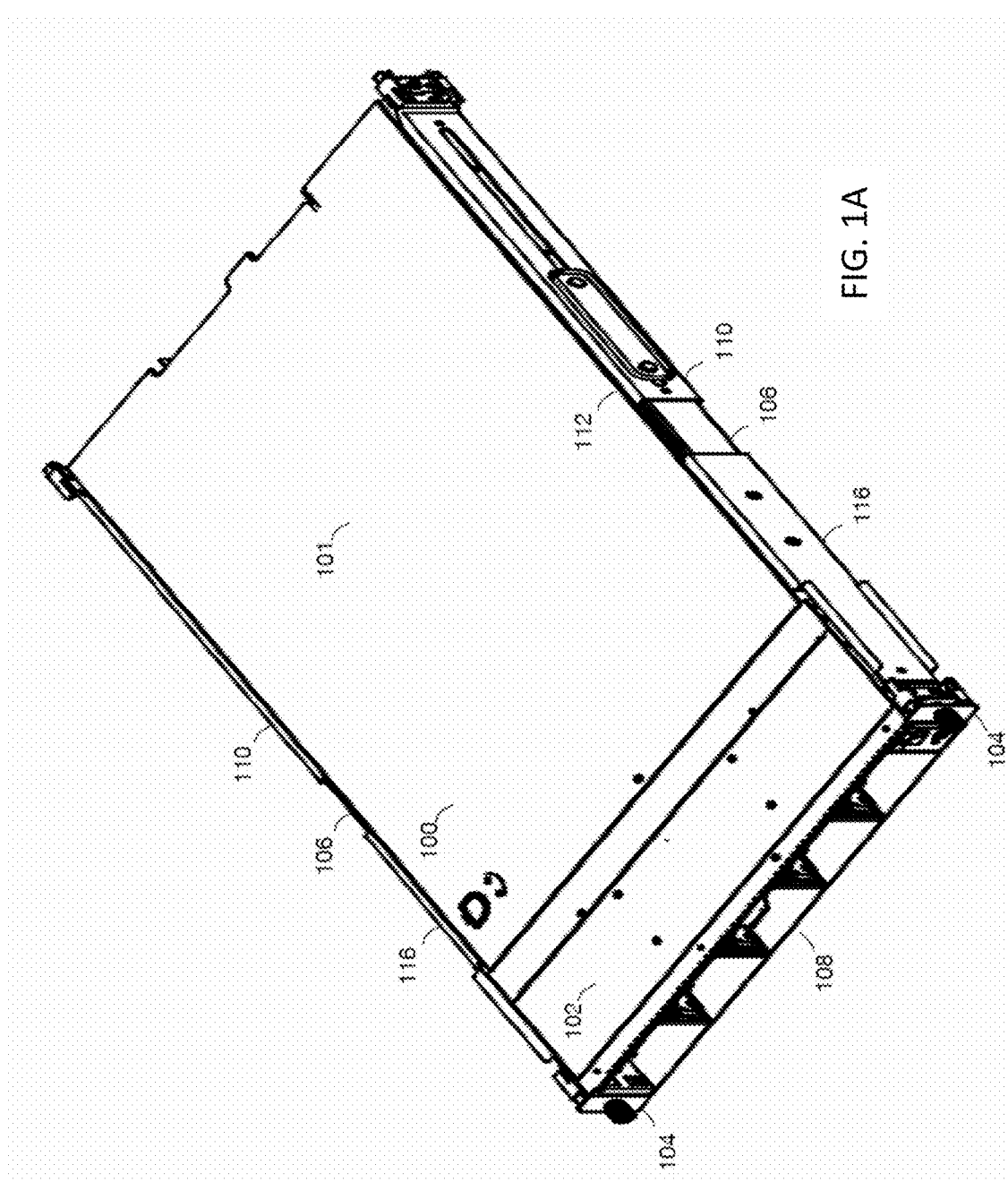
FIG. 1A is a schematic diagram of a chassis with different width front end hard drive module.

Various embodiments of the present technology are discussed in detail below. While specific implementations are discussed, it should be understood that this is done for illustration purposes only. A person skilled in the relevant art will recognize that other components and configurations may be used without departing from the spirit and scope of the present technology.

In server computing systems, a massive amount of electronic data is generated, stored, and recalled. The amount of data needed to be stored and recalled within these server systems is growing at an exponential rate. With the advent of new massive data applications that demand several trillions of pieces of data to be processed, the demand for hard drive space has grown more persistent.

While the demands have grown, current hard drive technology still demands a certain amount of physical space. However, as noted above, the hard drive resources are constrained by physical limitations. That is, although hard drive space can expand by additional hard drives being installed within a chassis, the unified server standards specify physical dimensions limiting the number of hard drives which can fit within a hard drive enclosure that conforms to the height and width of a 1U rack, a 2U rack, etc. In a common conventional setup, for example, a 1U server may only be able to fit four 2.5-inch hard disk drives within a single row, or eight 2.5-inch hard disk drives within two rows. Thus, to install more hard drives within a chassis, a 2U or 4U server unit may be required.

The solution proposed by the present invention is to alter the physical design of the chassis, such that the chassis features a different width front end hard disk drive (or "HDD") module. With a front end HDD module of a greater width, the chassis can include a greater number of hard drives enclosed within the module, resulting in a greater amount of electronic data to be stored and utilized. This enables chassis flexibility for different hard disk drive quantities. For an example in one embodiment, within a 1U chassis, the design can be such that the front end HDD module is of a greater width than the traditional 1U server, and can include twelve pieces of 2.5 inch drives in the chassis.

Although the different width front end module discussed in the exemplary embodiment here is a hard drive module, it should be appreciated by those with skill in the art that other modules can be substituted. The present invention can be used to increase space for other types of components.

In order for a chassis with a different width front end HDD module to be operable within the specifications of a traditional server rack, the present technology also provides a new configuration of sliding rails for the chassis to permit the different width front end HDD module. The new sliding rail configuration still allows for sliding the chassis out of the server rack as in conventional server systems. This new sliding rail configuration includes a set of sliding rails placed on each side of the chassis. The sliding rails each consist of a front support piece, rear support piece, inner rail, middle rail, and outer rail. Each of the rails extends along the length of the narrower, rear portion of the chassis. The inner rail is attached to the chassis and slidably engages with the middle rail to allow the inner rail to slide out of the middle rail to slide the chassis out of the server rack. The outer rail slidably engages with the middle rail to allow the middle rail to slide out of the outer rail to slide the chassis further out of the server rack. The rails are attached to the server rack via the front and rear support pieces, where the front support piece is configured to accommodate the wider front end HDD module when the chassis is slid in and out of the server rack. This allows for the chassis with the different front end width HDD module to easily and reliably slide in and out of the server rack for easy maintenance and serviceability. Specifics will be provided in the following discussion of the figures.

Figure 1B:
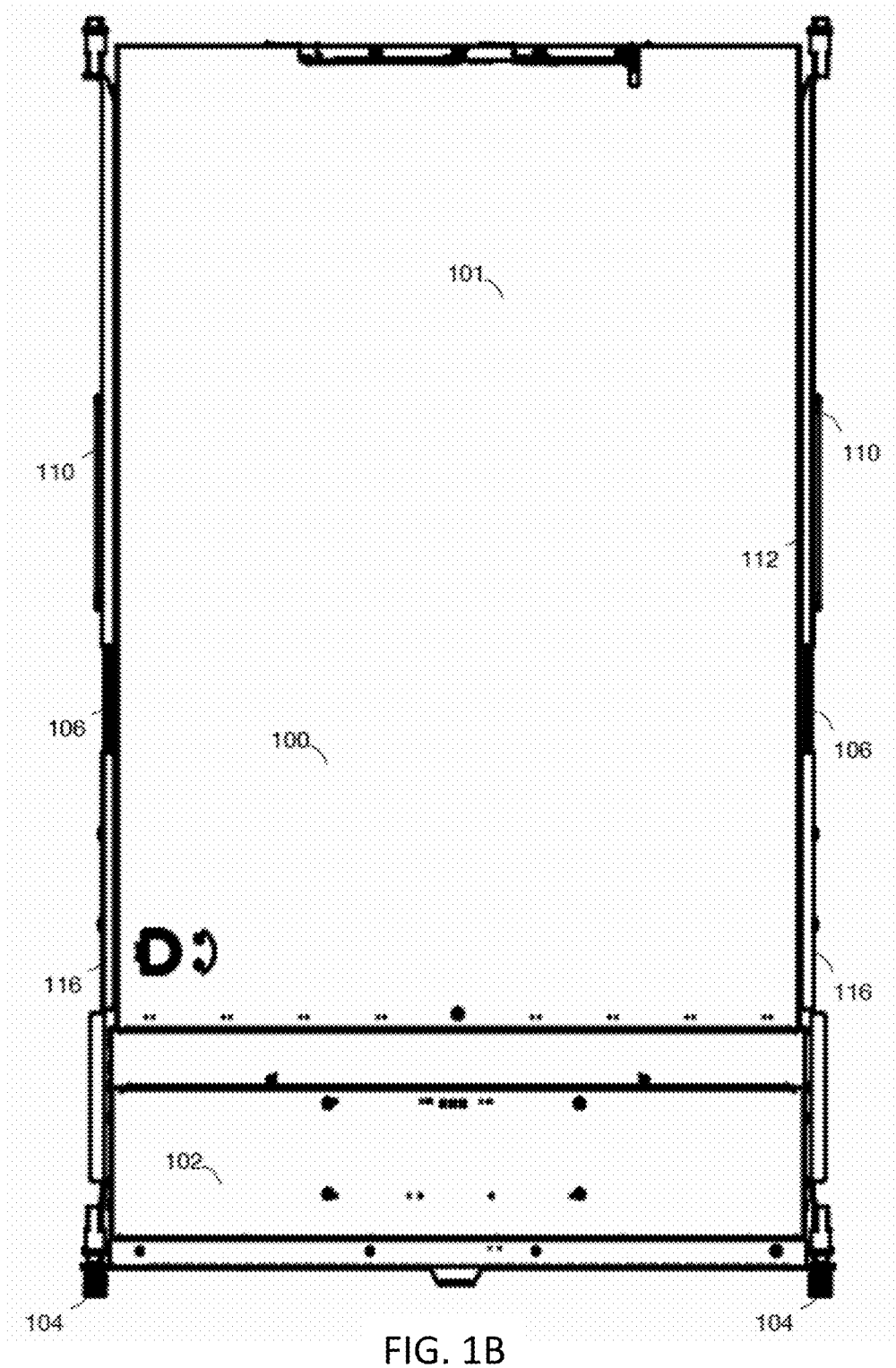
FIG. 1B is a top down view of a chassis with different width front end hard drive module.

FIG. 1A and FIG. 1B are schematic diagrams of a chassis 100 with a different width front end hard drive module 102. As shown in FIG. 1A and FIG. 1B, the rear chassis 101 of chassis 100 is connected to the front end hard disk drive module 102. In some embodiments, the rear chassis 101 and front end HDD module 102 are permanently attached and form a single unified chassis. In other embodiments, the rear chassis 101 and front end HDD module 102 are separate components that can be removably attached, allowing for replacement of the HDD module 102 and/or rear chassis 101 as needed. In some embodiments, the front end HDD module 102 and rear chassis 101 are connected and secured by screws. However, the present disclosure contemplates any type of fasteners or fastening system can be utilized in the present technology. Within FIG. 1A and FIG. 1B, the width of the rear chassis 101 is less than the width of the front end HDD module 102. In particular, the width of the rear chassis 101 would be a standard width for the rack into which it is to be inserted into.

As a single example within one embodiment, the width of the chassis 100 may be 438 millimeters, while the width of the front end HDD module 102 may be 447 millimeters. However, it will be appreciated that a wide variety of different widths and variances are possible within differing embodiments.

Returning to FIG. 1A and FIG. 1B, the front end HDD module 102 can include hard drive slots 108 or other similar supporting structures to allow for a number of hard disk drives to be inserted into the front end HDD module 102. In the exemplary embodiment, several hard disk drives are capable of being inserted into the front end HDD module 102. The greater width of the front end HDD module 102 allows for an increased quantity of hard disk drives to be inserted. Although space for ten hard disk drives is depicted in the exemplary embodiment, the number of hard disk drives may be six, ten, sixteen, twenty, or any number of hard disk drives, depending on the dimensions of each hard disk drive and the dimensions of the front end HDD module 102.

Referring back to the particular example, in the case of a 447 millimeter width for the front end HDD module 102, ten 2.5 inch hard disk drives can be inserted into the front end HDD module 102. In contrast, a conventional chassis of 438 millimeters would allow less than ten 2.5 inch hard disk drives to be inserted.

As with a conventional chassis, chassis 100 is attached to a server rack via a set of sliding rails. However, conventional sliding rails are configured to extend along an entire length of a chassis, where the width of such a chassis is constant. Accordingly, to accommodate a chassis according to the present technology, the present disclosure contemplates a new sliding rail design, as shown in FIG. 1A and FIG. 1B.

As shown in FIG. 1A and FIG. 1B, a set of sliding rails 112 is placed along each side of the chassis 100. Each set of sliding rails 112 consists of a front support piece 116, a rear support piece 110, and a sliding portion 106 which consists of an inner rail, an outer rail, and a middle rail.

The front support piece 116 can includes flange walls and extends along a portion of the chassis 100, specifically along the length of the different width front end HDD module 102. The front support piece 116 attaches to a front mounting rail of the cabinet enclosure, via the rail mounting flange 104, as shown in further detail below. The two rail mounting flanges 104 are provided for securing the chassis 100 within a server rack. A mounting ear and captive screw within each rail mounting flange 104 allow for such securing. In some embodiments, the mounting ear and captive screw can be replaced with other forms of securing the rail mounting flanges 104 to the mounting rails. One of the flange walls of the front support piece 116 covers the sliding portions 106 of the rails 112.

The sliding portions 106 comprise an inner rail, outer rail, and middle rail. The inner rail, outer rail and middle rail all extend along the entire length of the rear chassis 101, and are capable of slidably engaging with each other. The sliding portions 106 will be discussed below in greater detail in FIG. 3A, FIG. 3B, and FIG. 3C. The rear support piece 110 of the sliding rails extends along a portion of the rear chassis 101 and attaches to a rear mounting rail of the cabinet enclosure.

As the sliding portions 106 of the rails 112 extend only along the rear chassis 101 and no portion of the rails is directly attached to the front end HDD module 102, the weight of the chassis 100 is not evenly distributed along the rails 112. In particular, the front support piece 116 and forward portions of the sliding peortions 106 may experience greater levels of mechanical stress than the rear support piece 110 and rear portions of the sliding portions 106. Accordingly, the present disclosure contemplates that the front support pieces 116 are configured to provide additional support for this purpose, as further described below with respect to FIGS. 4 and 5.

Figure 2:
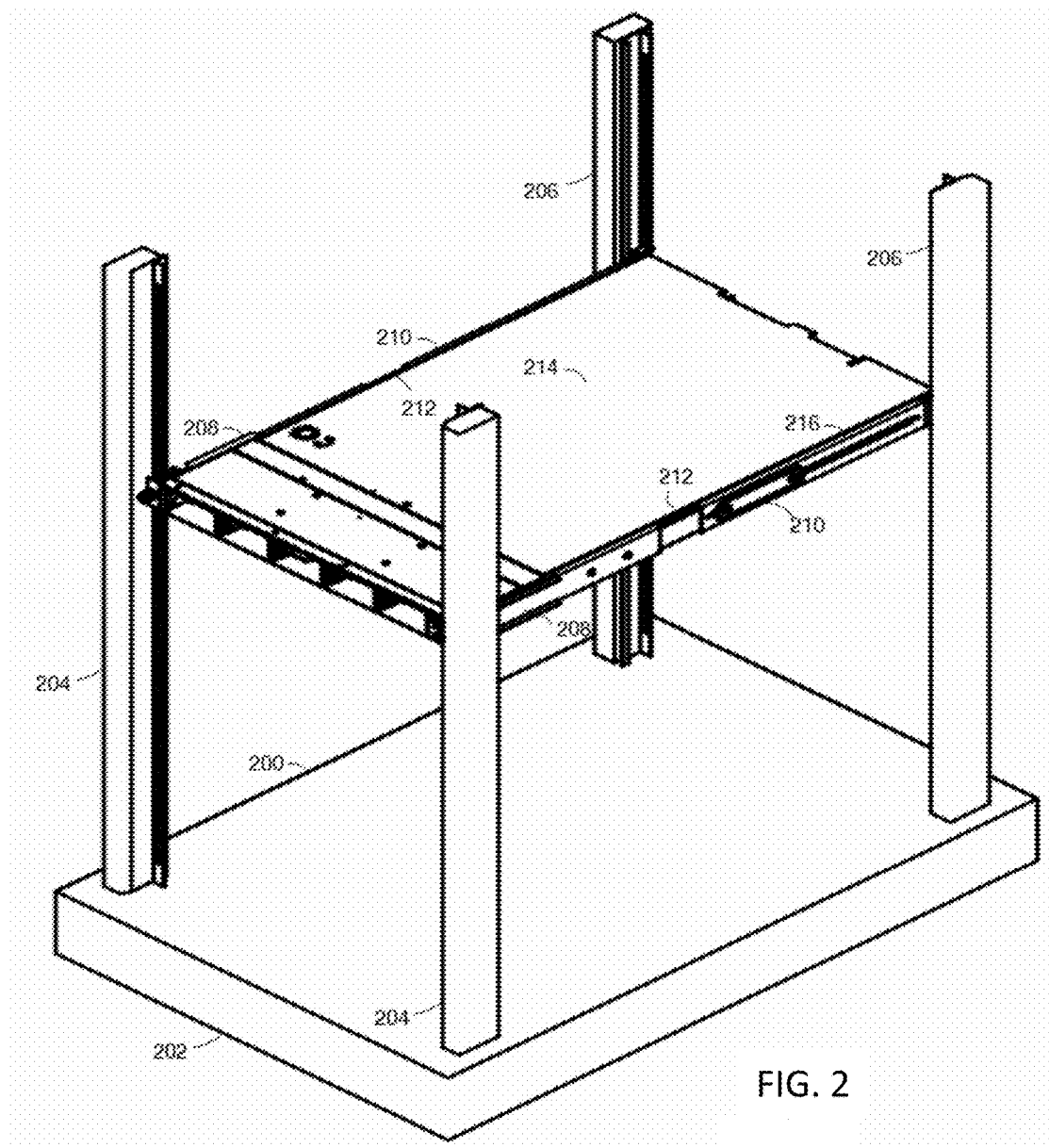
FIG. 2 is a schematic diagram of a rail and cabinet enclosure for a chassis with different width front end hard drive module.

FIG. 2 is a schematic diagram of a rail and cabinet enclosure, i.e., a server rack 200, for a chassis with different width front end hard drive module. FIG. 2 illustrates server rack 200 that includes a rack body or base 202 to support front mounting rails or supports 204 and rear mounting rails or supports 206, which are used for connecting a chassis 214 to the server rack 200 via the sliding rails 216 of the chassis 214. In FIG. 2, chassis 214 and sliding rails 216 can be configured substantially similar to chassis 100 and sliding rails 106 in FIG. 1A and FIG. 1B.

Referring back to FIG. 2, the front support pieces 208 of the sliding rails 216 are connected to front mounting supports 204 of the to the server rack 200. The front mounting supports 204 can run along the height of the server rack. In some embodiments, the front mounting supports 204 can contain holes for fitting a mounting ear and captive screw of a rail mounting flange of the front support pieces 208. Similarly, back mounting supports 206 may be connected to the rear support pieces 210 of the sliding rails 216 with additional rail mounting flanges.

Figure 3A:
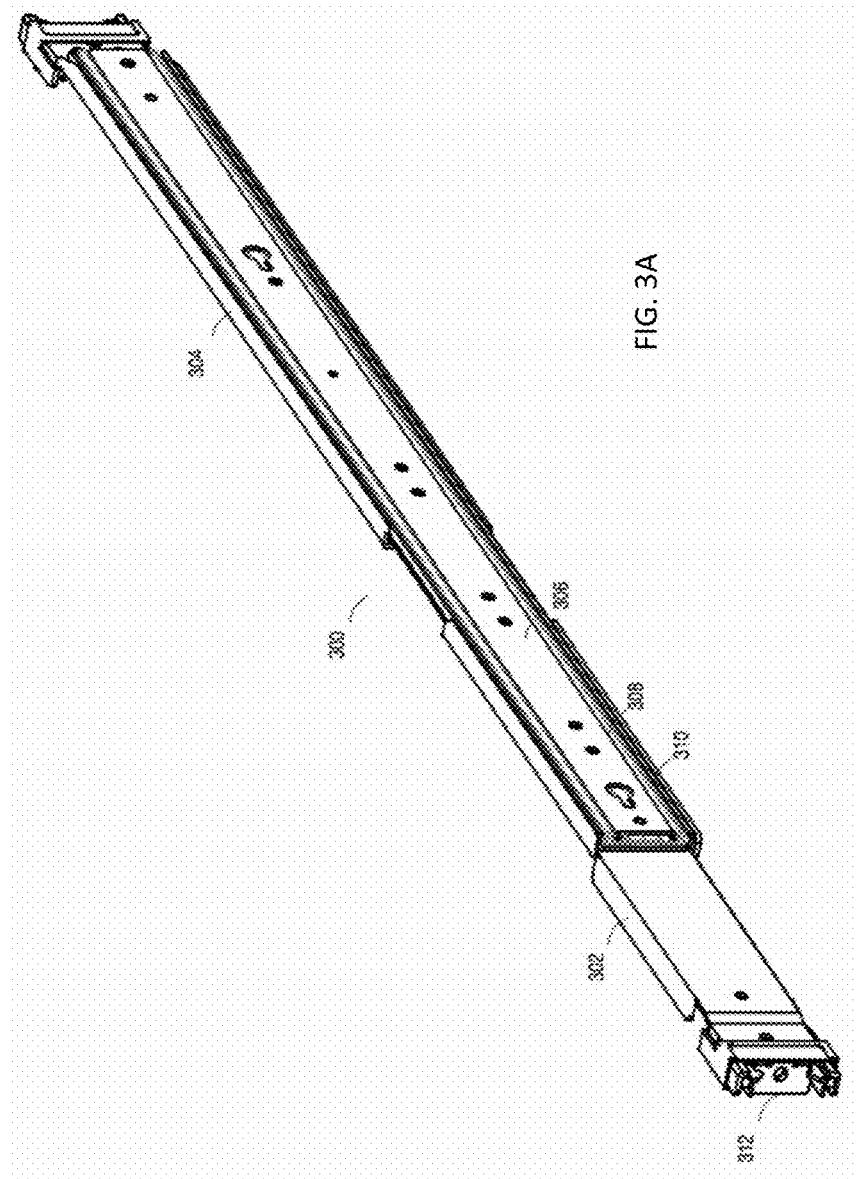
FIG. 3A is a schematic diagram of one set of sliding rails.
Figure 3B:
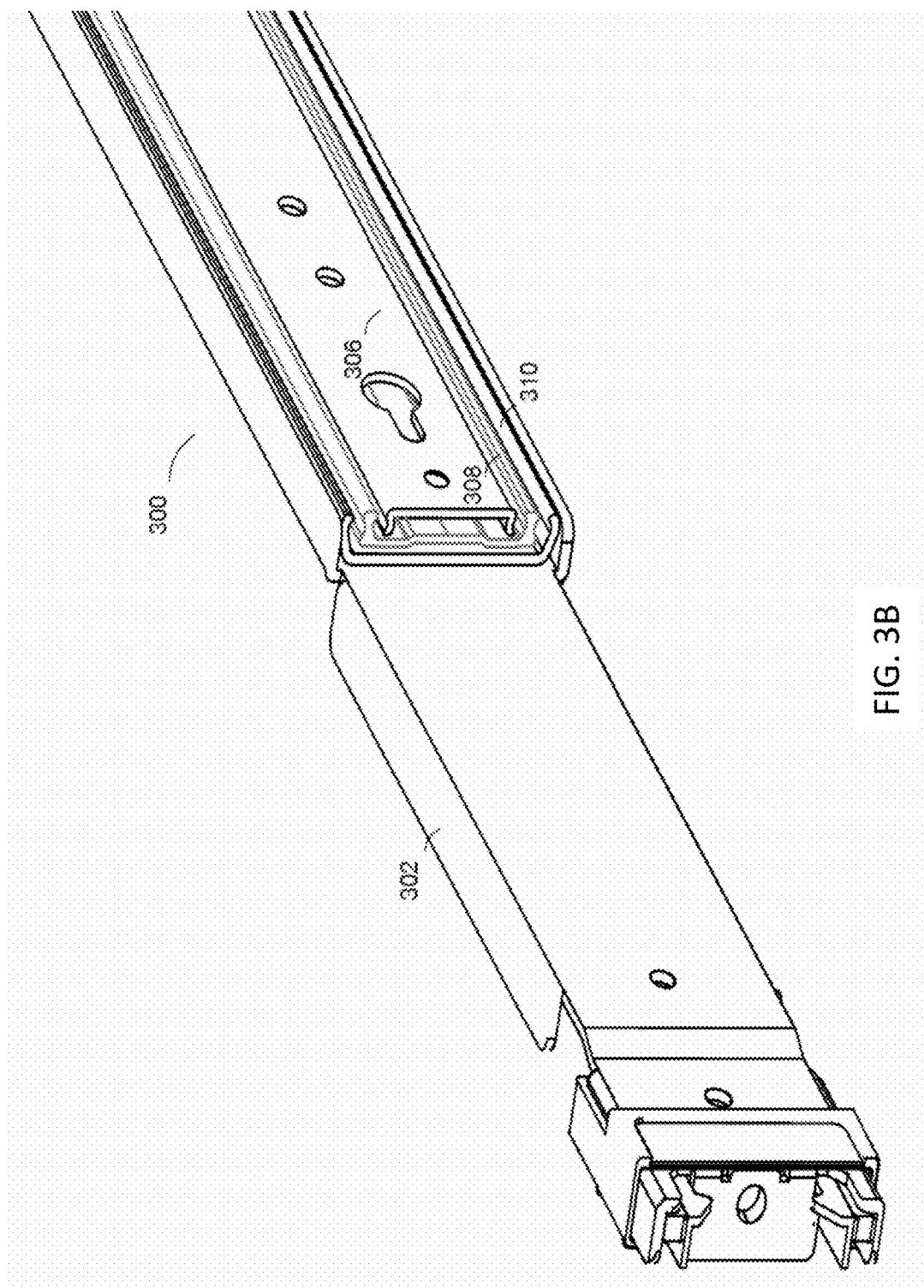
FIG. 3B is a schematic diagram of one set of sliding rails with a magnified view of the front portion.
Figure 3C:
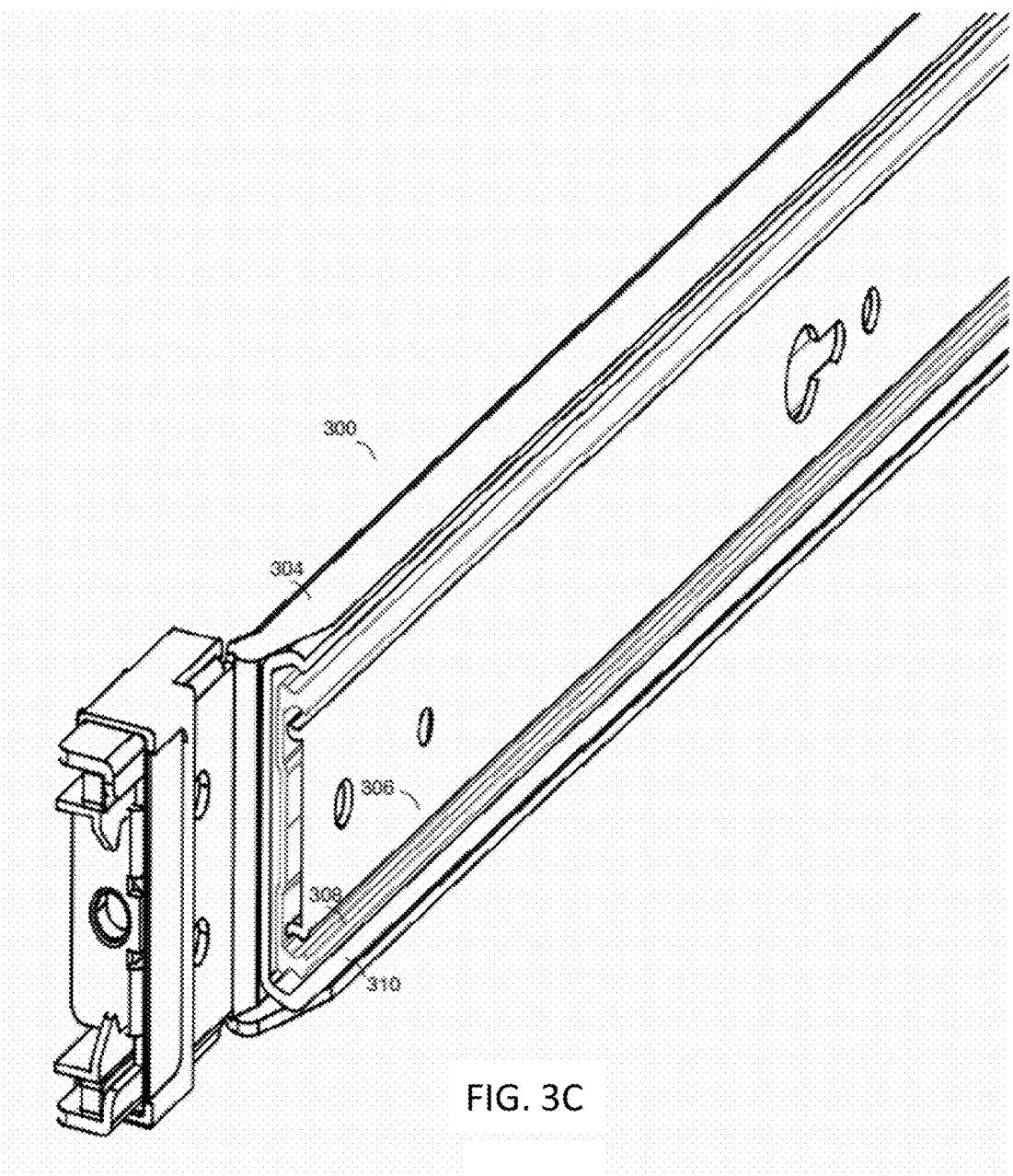
FIG. 3C is a schematic diagram of one set of sliding rails with a magnified view of the rear portion.

FIG. 3A is a schematic diagram of one of sliding rails 300 according to the present technology. The sliding rail 300 includes a front support piece 302, a rear support piece 304, an inner rail 306, a middle rail 308, and an outer rail 310. FIG. 3B is a magnified view of the front portion of FIG. 3A that focuses on the front support piece 302, inner rail 306, middle rail 308, and outer rail 310. FIG. 3C is a magnified portion of FIG. 3A that focuses on the rear support piece 304, inner rail 306, middle rail 308, and outer rail 310.

As previously discussed each of sliding rails 300 consists of five components: a front support piece 302, a rear support piece 304, an inner rail 306, a middle rail 308, and an outer rail 310. The inner rail 306 is configured to attachment to a chassis. Thus, as shown in FIGS. 3A-3C, the inner rail 306 may have mounting holes for fasteners. However, the present disclosure contemplates that the inner rail 306 can include other types of mounting structures.

As previously noted, the inner rail 306 slidably engages with the middle rail 308. This can be accomplished in a variety of ways. For example, each of inner rail 306 and middle rail 308 may have corresponding channels or tracks that engage with each other to allow the rails to slide with respect to each other. In another example, the rails may have corresponding channels for supporting ball bearings or the like to allow the rails to slide with respect to each other. In FIGS. 3A-3C, the inner rail 306 is shown as being inside middle rail 308. However, present disclosure contemplates other configurations are possible for arranging the inner rail 306 and the middle rail 308.

As also previously noted, the outer rail 310 slidably engages with the middle rail 308. This can also be accomplished in a variety of ways. For example, each of outer rail 310 and middle rail 308 may have corresponding channels or tracks that engage with each other to allow the rails to slide with respect to each other. In another example, the rails may have corresponding channels for supporting ball bearings or the like to allow the rails to slide with respect to each other. In FIGS. 3A-3C, the middle rail 308 is shown as being inside outer rail 310. However, present disclosure contemplates other configurations are possible for arranging the outer rail 310 and the middle rail 308.

As noted above, The inner rail 306, outer rail 310, and middle rail 308 all extend along the length of the narrower, rear portion of the chassis, but do not extend to the different width front end module. The inner rail 306 includes several points of attachment for connection with the chassis of the server unit. In operation, when the chassis is pulled out of the server rack, the inner rail 306 slides out of the middle rail 308. The present disclosure contemplates that the inner rail 306, the middle rail 308, or both, can have structures to prevent the inner rail 306 from sliding completely out of the middle rail 308. Once the inner rail 306 is fully extended, the middle rail 308 is capable of sliding the chassis out further. In particular, the middle rail 308 slides out of the outer rail 310. The present disclosure contemplates that the outer rail 310, the middle rail 308, or both, can have structures to prevent the middle rail 308 from sliding completely out of the outer rail 310.

In this way, the chassis, along with the different width front end module which is attached to it, can be pulled out and in with respect to the server rack which encloses the server unit, in the traditional way that server units can slide out of racks.

As previously discussed, the sliding rail 300 additionally includes a front support piece 302. A first end of the front support piece 302 attaches to a front mounting support within the cabinet enclosure via a rail mounting flange 312. The front support piece 302 contains flange walls, or lips, which provide stability and support. One of the flange walls covers the inner rail 306, outer rail 310, and middle rail 308 of the sliding rails. The front support piece 302 covers the full length of the different width front end module, and is wider than the chassis in order to support the larger width of the different width front end module. The second end of the front support piece 302 attaches to the outer rail 310. Screws or any other type of fasteners can be used to provide this attachment.

The sliding rail 300 additionally includes a rear support piece 304. A first end of the rear support piece 304 attaches to a rear mounting support within the cabinet enclosure. The rear support piece 304 extends along a portion of the chassis, and wraps around the inner rail 306, outer rail 310, and middle rail 308 of the sliding rails. A second end of the rear support piece 304 attaches to the outer rail 310. Screws or any other type of fasteners can be used to provide this attachment.

In some embodiments, the sliding components of the sliding rails may consist merely of an inner rail 306 and an outer rail 310, with a middle rail 308 absent and inner rail 306 and outer rail 310 configured to slidably engage with each other. In these embodiments, the inner rail slidably engages with the middle rail 308 until fully extended. Without a middle rail 308, extension may be limited, but sufficient for some chassis configurations.

In some embodiments, the front support piece 302 and rear support piece 304 may be embodied as a single, unified support piece which wraps around the inner rail, outer rail and middle rail, and which connects to both a front mounting support and a rear mounting support.

Figure 4:
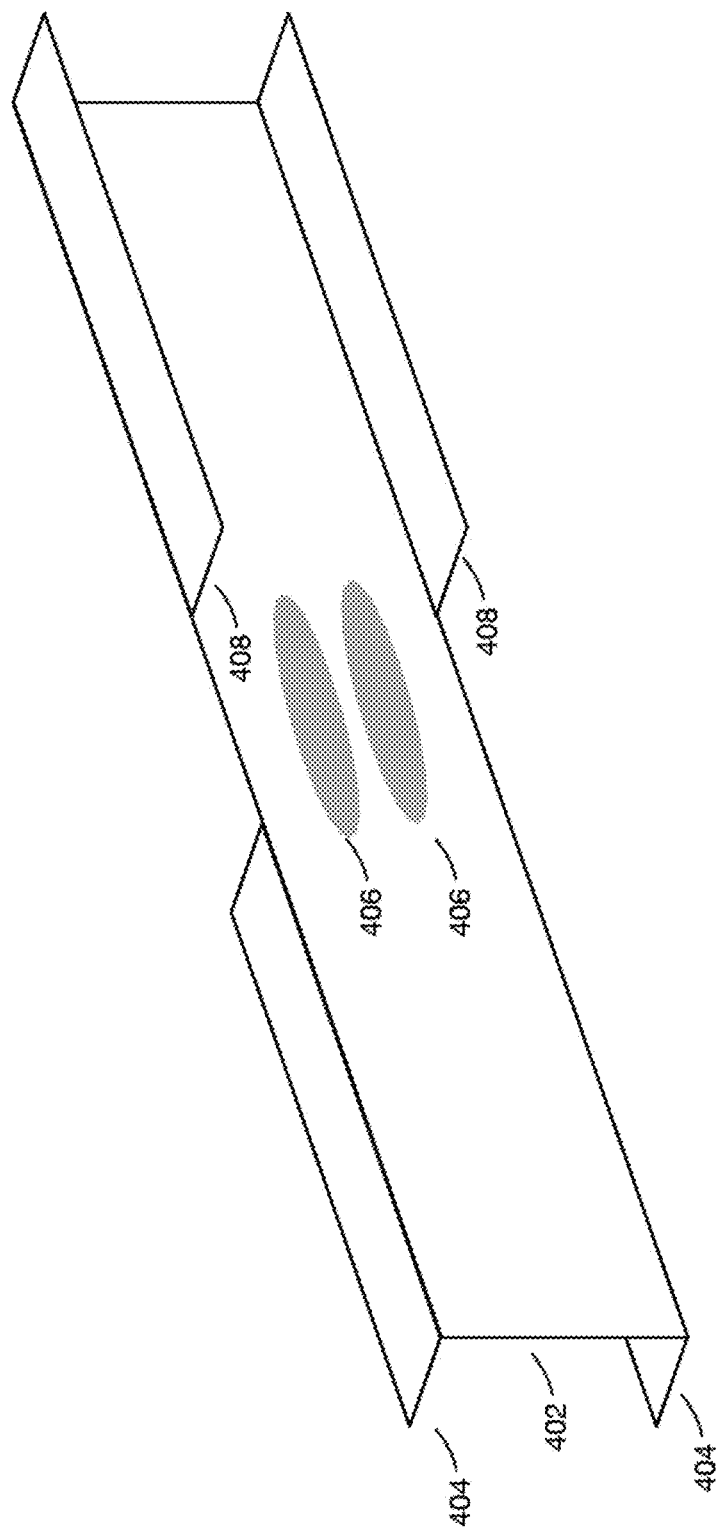
FIG. 4 is a schematic diagram of a front support piece reinforcement by ribs.

FIG. 4 is a schematic diagram of a portion of the front support piece 402 of the rail with reinforcement by ribs 406. As noted above, because of the uneven weight distribution along rail, stress is likely to be greatest at front support piece. The portion of the front support piece 402 is illustrated as a long strip, and can be composed of any sturdy material suitable for a server rail, such as steel. Although the portion of the front support piece 402 is depicted in FIG. 4 as a single long strip, it may be represented in other ways to fit the housing of both a front end HDD module and a chassis, as depicted in FIG. 1A and FIG. 1B.

In some embodiments, the front support piece 402 includes flange walls. In the exemplary embodiment, two flange walls 404 in a first direction are built into the front support piece 402. Two flange walls 408 in a second, opposite direction are also built into the front support piece 402. The first two flange walls 404 and the second two flange walls 408 provide a stronger backing support and reinforcement which will compensate for some of the stress put on the front support piece by a chassis.

In the exemplary embodiment, the front support piece 402 is further reinforced by ribs 406, which serve to reinforce loading strength of the sliding rails. The reinforcement ribs 406 provide an added joining support for the front support piece 402.

Figure 5:
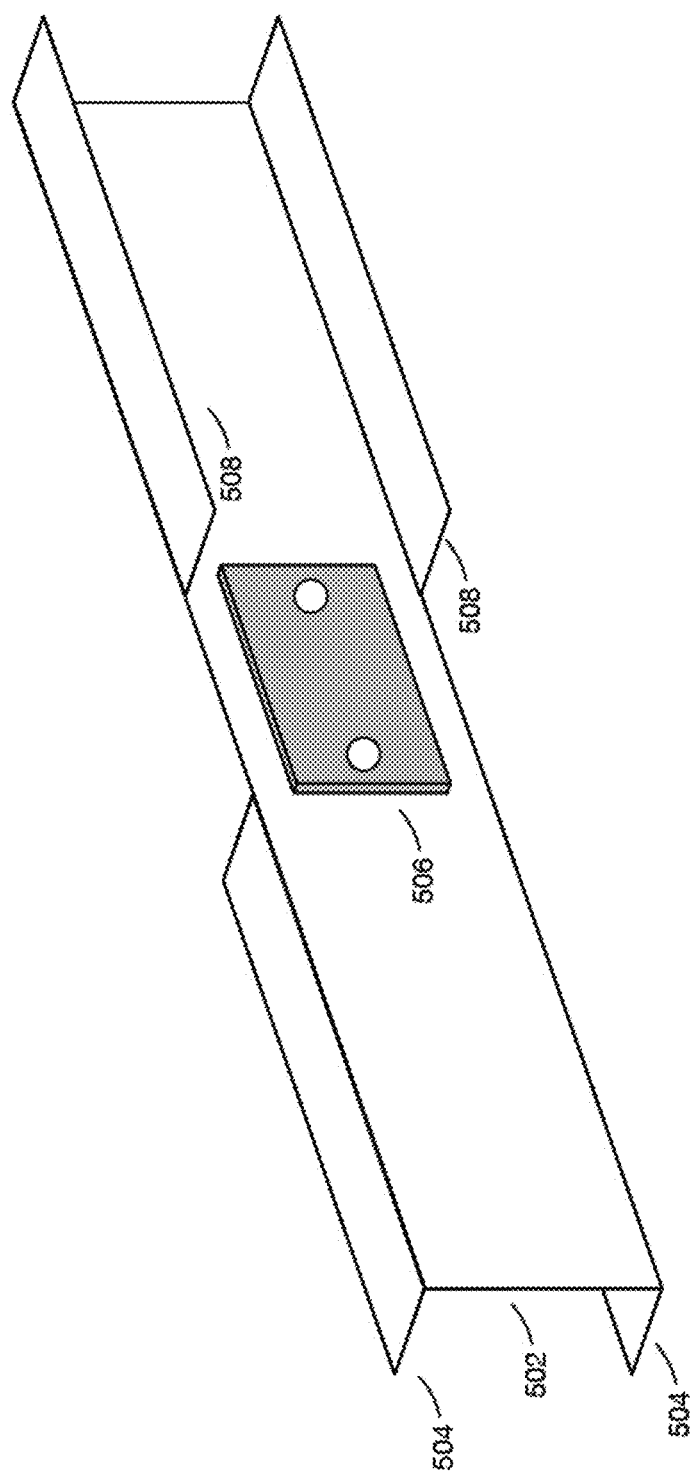
FIG. 5 is a schematic diagram of a front support piece reinforcement by metal backing.

FIG. 5 is a schematic diagram of a portion of the front support piece 402 of the rail with reinforcement by metal backing. FIG. 5 is nearly identical to FIG. 4, in that it depicts a portion of front support piece 502, flange walls 504 in one direction, and flange walls 508 in an opposite direction. Rather than reinforcement ribs, a metal backing 506 is used in FIG. 5 to reinforce the loading strength of the front support piece. This metal backing, in the exemplary embodiment, provides additional support that may be needed to deal with the stress which is put on the front support piece 502 by the server rack.

Although the foregoing examples have been described in some detail for purposes of clarity of understanding, the above-described inventive techniques are not limited to the details provided. There are many alternative ways of implementing the above-described invention techniques. The disclosed examples are illustrative and not restrictive.

What is claimed is:

1. A chassis, comprising:
   a housing comprising a front portion and a rear portion along the length of the housing, a width of the front portion greater than a width of the rear portion; and
   a first and second set of rails attached to the housing adapted for attachment to a rack, each set of rails comprising:
      a first rail attached to the housing and extending along the length of the rear portion,
      a second rail slidably engaging the first rail and extending along the length of the rear portion, and
      at least one support piece attached to the second rail and extending at least along a length of the front portion, the at least one support piece dimensioned to accommodate the width of the front portion when the first rail and the second rail are in an non-extended arrangement, wherein the at least one support piece comprises a front support piece and a rear support piece, wherein the front support piece comprises first and second flange portions, wherein each of the first and second flange portions comprises a flange wall, and wherein the flange walls of the first and second flange portions face in opposite directions.

2. The chassis of claim 1, further comprising a third rail slidably engaging the first rail and the second rail and extending along the length of the rear portion.

3. The chassis of claim 1, wherein the front support piece further comprises a reinforcing component.

4. The chassis of claim 3, wherein the reinforcing component is located between two discontinuous flange walls on the front support piece.

5. The chassis of claim 3, wherein the reinforcing component comprises ribs.

6. The chassis of claim 3, wherein the reinforcing component comprises a metal plate.

7. The chassis of claim 1, wherein the front portion comprises a hard disk drive module.

8. The chassis of claim 1, wherein the first and second set of rails further comprise a rear support portion attaching to the rack.

9. A chassis adapted to be slidably attached to a rack, comprising:
   a chassis comprising a front portion and a rear portion along the length of the housing, wherein the front portion is wider than the rear portion; and a first and second set of rails attached to the housing adapted for attachment to a rack, each set of rails comprising:
      a first rail attached to the housing and extending along the length of the second rear portion,
      a second rail slidably engaging the first rail and extending along the length of the rear portion,
      a third rail slidably engaging the first rail and the second rail and extending along the length of the rear portion, and
      at least one support piece attached to the second rail and extending at least along a length of the front portion, the at least one support piece dimensioned to accommodate the width of the front portion when the first rail and the second rail are in a non-extended arrangement, wherein the at least one support piece comprises a front support piece and a rear support piece, wherein the front support piece comprises first and second flange portions, wherein each of the first and second flange portions comprises a flange wall, and wherein the flange walls of the first and second flange portions face in opposite directions.

10. The chassis of claim 9, wherein the front support piece further comprises a reinforcing component.

11. The chassis of claim 10, wherein the reinforcing component is located between two discontinuous flange walls on the front support piece.

12. The chassis of claim 10, wherein the reinforcing component comprises ribs.

13. The chassis of claim 10, wherein the reinforcing component comprises a metal plate.

14. The chassis of claim 9, wherein the front portion comprises a hard disk drive module.

15. A chassis adapted to be slidably attached to a rack, comprising:
    a chassis comprising a front portion and a rear portion along the length of the housing, wherein the front portion is wider than the rear portion; and a first and second set of rails attached to the housing adapted for attachment to a rack, each set of rails comprising:
       a first rail attached to the housing and extending along the length of the second rear portion,
       a second rail slidably engaging the first rail and extending along the length of the rear portion,
       a third rail slidably engaging the first rail and the second rail and extending along the length of the rear portion, and
       at least one support piece attached to the second rail and extending at least along a length of the front portion, wherein the at least one support piece dimensioned to accommodate the width of the first front portion when the first rail and the second rail are in an non-extended arrangement, and wherein the at least one support piece comprises a front support piece and a rear support piece, the front support piece adapted for the accommodating of the width of the front portion when the first rail and the second rail are in a non-extended arrangement, wherein the at least one support piece comprises a front support piece and a rear support piece, wherein the front support piece comprises first and second flange portions, wherein each of the first and second flange portions comprises a flange wall, and wherein the flange walls of the first and second flange portions face in opposite directions.

16. The chassis of claim 15, wherein the reinforcing component is located between two discontinuous flange walls on the front support piece.

17. The chassis of claim 15, wherein the reinforcing component comprises ribs.

18. The chassis of claim 15, wherein the reinforcing component comprises a metal plate.

19. The chassis of claim 15, wherein the first front portion comprises a hard disk drive module.

\* \* \* \* \*